+# (12) United States Patent
Ding et al.

(10) Patent No.: US 7,294,574 B2
(45) Date of Patent: Nov. 13, 2007

(54) SPUTTER DEPOSITION AND ETCHING OF METALLIZATION SEED LAYER FOR OVERHANG AND SIDEWALL IMPROVEMENT

(75) Inventors: Peijun Ding, Saratoga, CA (US); Fuhong Zhang, Cupertino, CA (US); Hsien-Lung Yang, Campbell, CA (US); Michael A. Miller, Sunnyvale, CA (US); Jianming Fu, Palo Alto, CA (US); Jick M. Yu, San Jose, CA (US); Zheng Xu, Foster City, CA (US); Fusen Chen, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 34 days.

(21) Appl. No.: 10/915,139

(22) Filed: Aug. 9, 2004

(65) Prior Publication Data

US 2006/0030151 A1    Feb. 9, 2006

(51) Int. Cl.
*H01L 21/44* (2006.01)

(52) U.S. Cl. .............................. 438/687; 257/E21.477; 257/E21.478

(58) Field of Classification Search ................ 438/687, 438/653; 257/E21.477, E21.478; 427/96.8, 427/124

See application file for complete search history.

(56) References Cited

U.S. PATENT DOCUMENTS

| | | | |
|---|---|---|---|
| 5,171,412 A | 12/1992 | Talieh et al. ............. | 204/192.15 |
| 6,179,973 B1 | 1/2001 | Lai et al. ................ | 204/192.12 |
| 6,184,137 B1 | 2/2001 | Ding et al. .................. | 438/687 |
| 6,197,167 B1 | 3/2001 | Tanaka ................... | 204/192.15 |
| 6,274,008 B1 | 8/2001 | Gopalraja et al. ..... | 204/192.17 |
| 6,423,192 B1 * | 7/2002 | Wada et al. ........... | 204/192.12 |

(Continued)

FOREIGN PATENT DOCUMENTS

EP    0 878 843    11/1998

(Continued)

OTHER PUBLICATIONS

Miyake et al., "Effects of atomic hydrogen on Cu reflow process", *Stress Induced Phenomena in Metallization*, Fourth International Workshop, Tokyo, Japan, Jun. 1997, AIP Conference Proceedings 481, 1998, 419-423 pp.

(Continued)

*Primary Examiner*—Caridad Everhart
(74) *Attorney, Agent, or Firm*—Charles S. Guenzer

(57) ABSTRACT

An integrated sputtering method and reactor for copper or aluminum seed layers in which a plasma sputter reactor initially deposits a thin conformal layer onto a substrate including a high-aspect ratio hole subject to the formation of overhangs. After the seed deposition, the same sputter reactor is used to sputter etch the substrate with energetic light ions, especially helium, having an energy sufficiently low that it selectively etches the metallization to the heavier underlying barrier layer, for example, copper over tantalum or aluminum over titanium. An RF inductive coil generates the plasma during the sputtering etching while the target power is turned off. A final copper flash step deposits copper over the bare barrier field region before copper is electrochemically plated to fill the hole. The invention also includes a simultaneous sputter deposition and sputter etch, and an energetic ion processing of the copper seed sidewall.

40 Claims, 4 Drawing Sheets

U.S. PATENT DOCUMENTS

| | | | |
|---|---|---|---|
| 6,605,197 B1 | 8/2003 | Ding et al. | 204/192.15 |
| 6,709,970 B1 | 3/2004 | Park et al. | 438/620 |
| 2002/0088716 A1* | 7/2002 | Pavate et al. | 205/184 |
| 2003/0000474 A1* | 1/2003 | Voutsas et al. | 118/715 |
| 2004/0013818 A1* | 1/2004 | Moon et al. | 427/576 |
| 2004/0121608 A1* | 6/2004 | Shue et al. | 438/696 |
| 2005/0205211 A1* | 9/2005 | Singh et al. | 156/345.48 |

FOREIGN PATENT DOCUMENTS

JP     403034317 A   *   2/1991   ................ 438/656

OTHER PUBLICATIONS

Asamaki et al., "Filling of deep-sub-μm through holes and trenches by high vacuum planar magnetron sputter", *Electrochemistry*, vol. 69, No. 10, 2001, 769-772 pp.

\* cited by examiner

SPUTTER DEPOSITION AND ETCHING OF METALLIZATION SEED LAYER FOR OVERHANG AND SIDEWALL IMPROVEMENT

FIELD OF THE INVENTION

The invention relates generally to sputtering of materials. In particular, the invention relates to a sputter etching process performed as part of a sputter deposition process.

BACKGROUND ART

Sputtering, alternatively called physical vapor deposition (PVD), is the most prevalent method of depositing layers of metals and related materials in the fabrication of integrated circuits. Although originally sputtering was principally used to deposit substantially planar layers for horizontal interconnects and other electrical structures, more recently various sputtering techniques have been developed to coat thin, substantially conformal metal or metal nitride layers in holes formed in a dielectric layer. Such holes can be very narrow vias penetrating the dielectric layer to provide vertical electrical interconnections between wiring layers or can be relatively narrow trenches formed in the surface of the dielectric layer to provide horizontal electrical interconnections in the upper wiring layer. Narrow trenches can also be formed in silicon to form trench capacitors for which a thin dielectric gap layer and an inner electrode need to be coated into the trench.

Sputtering technology faces increasing challenges as the feature size of advanced integrated circuits continues to decrease. Sputtering is fundamentally a ballistic process ill suited to coat the walls of high aspect-ratio holes. A typical via structure is illustrated in the cross-sectional view of FIG. 1. A lower dielectric layer 10 includes a conductive feature 12 formed in its surface. The dielectric material is typically based on silicon dioxide although doped silica and other types of low-k dielectric materials are being increasingly used. The conductive feature 12 is usually part of a lower wiring layer and is thus most often composed of aluminum or, in more advanced circuits, copper. The lower layer 10 may alternatively be a crystalline silicon substrate, in which case the conductive feature 12 may be a doped contact region or silicided electrode.

An upper dielectric layer 14 is deposited over the lower dielectric layer 10 and its conductive feature 12. A hole 16 is etched through the upper dielectric layer 14 overlying the conductive feature. The thickness of the dielectric layer 14 is generally constrained to be almost 1 μm in order to prevent dielectric breakdown and to reduce cross talk. However, the width of the via hole 16 in current advanced circuits is about 0.13 μm and technology is being developed for further reductions to 65 nm and below. As a result, the via holes 16 have increasing aspect ratios. Other types of holes 16 are included within the invention, but via holes present some of the greatest challenges.

A barrier layer 18 is deposited onto the sidewalls of the hole 16 and on the planar field region on the top of the dielectric layer 14. In the case of copper metallization, the barrier layer 18 is typically composed of the refractory metal tantalum, or tantalum nitride, or a bi-layer of the two. In the case of aluminum metallization, the barrier layer 18 is typically composed of the refractory metal titanium, titanium nitride, or a bi-layer of the two. The barrier layer 18 prevents diffusion between the dielectric and the metal filled into the hole. Metal diffusing into the dielectric may create a short. Oxygen diffusing into the metallization degrades the metallic conductivity. The barrier layer 18 also acts as an adhesion layer to the dielectric, particularly for copper which does not wet well onto silica. Sputtering techniques, sometimes in combination with chemical vapor deposition (CVD) are available to achieve the barrier structure somewhat idealized in FIG. 1.

A metal seed layer 20 is then deposited in a substantially conformal process. The seed layer 20 is typically composed of the same metal used for the metallization fill, that is, a copper seed layer for copper metallization and an aluminum seed layer for aluminum metallization. It is understood that copper or aluminum may be composed of alloys containing up to 10 wt % of one or more alloying elements as well as the principal copper or aluminum. A field seed region 22 of the seed layer 20 is often relatively thick because of the generally isotropic flux distribution of neutral sputtered atoms. A sidewall seed region 24 presents a challenge in high aspect-ratio holes so that its thickness is small but needs to be continuous. A bottom seed region 26 is advantageously formed to a somewhat greater thickness. After the seed layer 20 has been deposited, the metallization metal is filled into the hole 16 to complete the metallization. For copper metallization, electrochemical plating (ECP) is typically used to fill the hole 16. The copper seed layer 20 both nucleates the ECP copper and serves as the plating electrode. Aluminum fill is most often performed by sputtering so a distinctly different aluminum seed layer is not required. However, the initial stages of aluminum sputtering present some of the same problems to be described for a copper seed layer. For these and other reasons, in very narrow holes, an initial aluminum layer may be sputtered under significantly different conditions such as lower temperature than for the sputter fill aluminum in order to deposit a thin, uniform layer well adhered to the barrier while the higher-temperature fill sputter promotes reflow into the hole so as to avoid any voids.

Sputtering of aluminum or copper targets respectively can be used to deposit either aluminum or copper in a thin nearly conformal layer required for the seed layer 20. Bottom and sidewall coverage can be increased by causing a substantial fraction of the sputtered atoms to be ionized and biasing the wafer to attract the metal ions deep into the hole 16. However, sputtering tends to create overhangs 28 in the seed layer 20 on the upper corner of the hole 16. The overhangs 28 are believed to arise principally from the neutral component of the sputter flux which is somewhat isotropic with approximately a cosine distribution about the vertical axis. Such overhangs 28 may introduce serious problems. The overhangs 28 progressively grow and narrow the throat of the hole 16 during the sputter deposition, thus effectively increasing the aspect ratio and thus further decreasing the sputter flux into the hole 16. Even for an ECP fill, the overhangs 28 present an impediment to the flow of fresh electrolyte. In a worst case, the overhangs 28 can bridge the hole 16 and prevent any further deposition into the hole 16.

Sputter overhangs can be reduced in a number of ways. If the sputter flux is highly ionized, biasing converts the flux distribution to be heavily forward directed and not favoring deposition on the exposed overhang corner and the energetic sputter ions also tend to etch the overhangs. This approach has its own disadvantages. Very high ionization fractions are achieved in reactors including complexly shaped sputtering targets, for example, the single right cylindrical vault of a hollow cathode magnetron (HCM) reactor or the annular vault of an SIP$^+$ reactor, both requiring strong complex magnetrons to increase the plasma density and to direct the flow of sputter ions. Such complexly shaped targets are expensive, a drawback for commercial production. Also, a high bias in the presence of a high ionization fraction may produce a net etching effect in the field region. Not only is no metal deposited there, but the field barrier may be removed.

These techniques, however, become increasingly difficult with narrowing holes. The thicknesses of the barrier and seed layers must be decreased to not unduly reduce the effective width of the already narrow holes. Argon or copper sputtering etching is relatively unselective between the copper and the underlying tantalum. If the barrier layer is exposed either at the hole corner or in the field region, excessive sputter etching is likely to etch through the barrier layer and thus severely affect reliability of the manufactured device. A similar lack of etching selectivity occurs with aluminum and its titanium barrier.

For commercial manufacture, in which yield is a critical economic driver, any advanced process must provide uniform results over the wafer. Otherwise, some of the chips will fall outside the narrow design rules and suffer problems with reliability.

The invention yet further includes flowing argon into a plasma reactor and exciting it into a plasma and then at least partially substituting helium for argon while maintaining the plasma to obtain a helium plasma.

SUMMARY OF THE INVENTION

One aspect of the invention includes a method of metallizing a hole such as a via in an integrated circuit. The method includes a first step of depositing a thin layer of the metallization and then sputter etching with a light ion having a mass less than that of the metallization element. Helium, nitrogen, and neon are examples of the sputter etching ion, and they may be applied in combination with each other or in combination with argon. The method is particularly effective when the hole is precoated with a barrier layer including a barrier metal element heavier than the metallization element. The light-ion energy is chosen such that it sputters the metallization with high selectivity to the underlying barrier metal. The selectivity is believed to arise in large part from mass differences.

Examples include copper metallization and tantalum barrier and aluminum metallization and titanium barrier.

Another aspect of the invention includes sputter etching already deposited copper with argon ions as well as other ions to produce more uniform sidewall coverage.

The method is preferably practiced in the same sputter reactor used to sputter deposit the first metal layer. In the case of copper metallization, the first layer is a seed layer also used for an electroplating electrode. In this case, the same copper sputter reactor may also be used to subsequently deposit a thin copper layer to cover the barrier field region on the planar surface.

The invention further includes simultaneous sputter deposition and sputter etching by use of argon as both a target and a substrate sputter gas. Preferably, the substrate sputter etching is promoted by an RF coil intermediate the target and substrate.

The invention includes an aluminum or copper sputter reactor fit with argon and helium or neon gas supplies into the main chamber body. It also includes an aluminum or most particularly a copper sputter reactor having an RF coil inductively coupling power into the process area and a pedestal electrode supporting the substrate which is RF biased through a capacitive coupling and matching circuit.

DETAILED DESCRIPTION OF THE PREFERRED EMBODIMENTS

Figure 2:
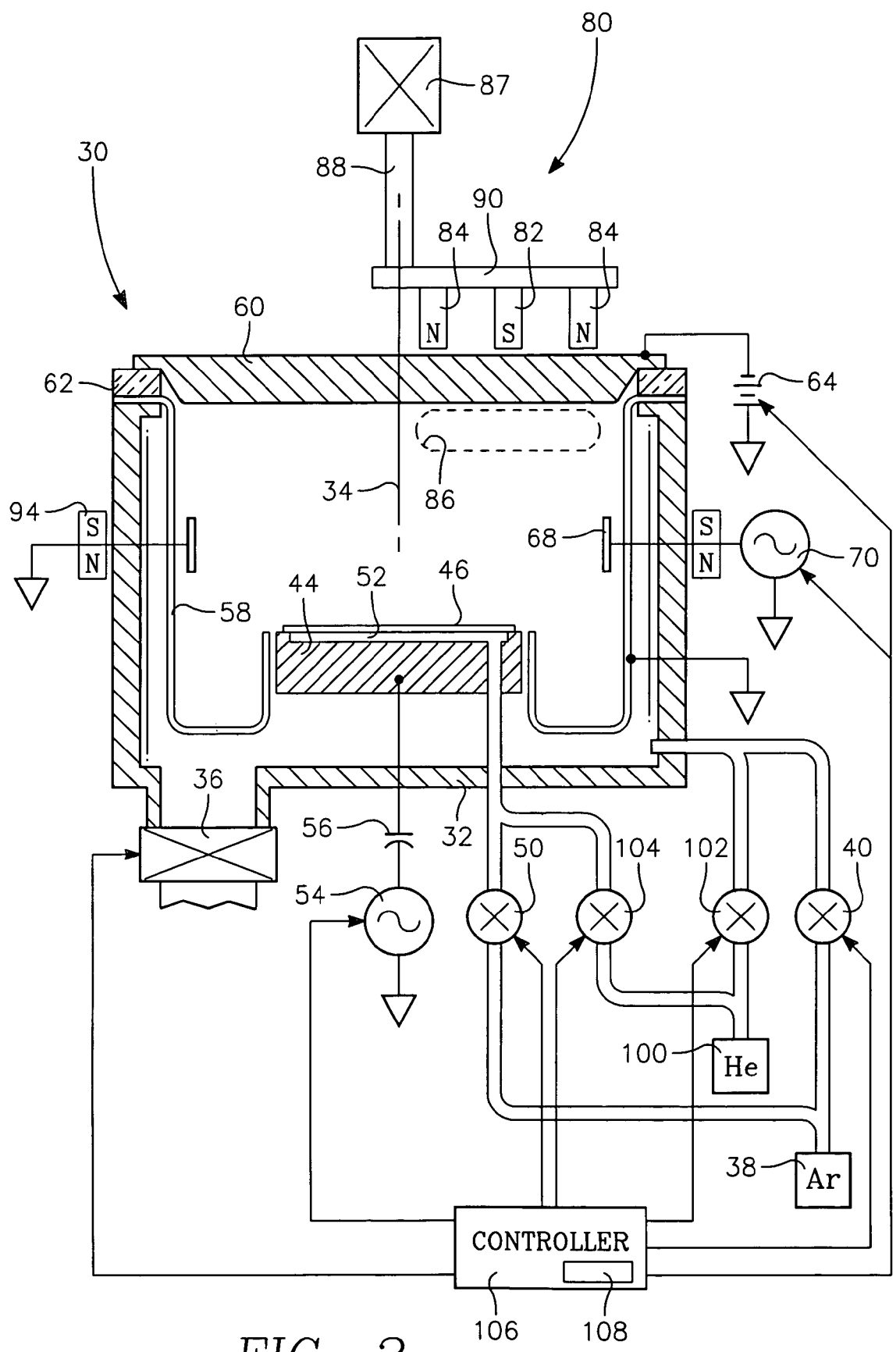
FIG. 2 is a schematic cross sectional view of a sputter reactor usable with the invention.

One embodiment of the invention may be practiced in a sputter reactor capable of both sputtering depositing target material on a substrate and sputter etching the same substrate The sputter etching of the overhangs or other features is advantageously performed with a gas lighter than the usual argon sputter working gas. One example of such a magnetron sputter reactor 30 is illustrated in schematic cross sectional view in FIG. 2 is available from Applied Materials, Inc. of Santa Clara, Calif. although it was previously used with a tantalum target for barrier deposition rather than for copper or aluminum sputtering. The reactor 30 includes a vacuum chamber 32 arranged generally symmetrically about a central axis 34. A vacuum pump system 36 pumps the chamber 32 to a very low base pressure in the range of $10^{-6}$ Torr. However, an argon gas source 38 connected to the chamber 32 through a mass flow controller 40 supplies argon as a sputter working gas into the chamber 32. The argon pressure inside the chamber 32 is typically held in the low milliTorr range, at least during plasma ignition.

A pedestal 44 arranged about the central axis 34 holds a wafer 46 or other substrate to be sputter coated. An unillustrated clamp ring or electrostatic chuck may be used to hold the wafer 46 to the pedestal 44. The pedestal 44 may be either heated or cooled depending upon the desired temperature of the wafer 46 during the processing. The argon gas source 38 supplies argon as a thermal transfer gas through another mass flow controller 50 to a cavity 52, typically having a multi-branched structure, between the wafer 46 and the temperature controlled pedestal 44 to facilitate and control the thermal flow between them.

An RF power supply 54 is connected through a capacitive coupling circuit 56 to the pedestal 44, which is conductive and acts as an electrode. In the presence of a plasma, the RF biased pedestal 44 develops a negative DC self-bias, which is effective at attracting and accelerating positive ions in the plasma towards the wafer 46. An electrically grounded shield 58 protects the chamber walls and the sides of the pedestal 44 from sputter deposition. A target 60 is arranged in opposition to the pedestal 44 and is vacuum sealed to the chamber 32 through an isolator 62. Additional ungrounded shields may be positioned closer to the target 60. At least the front surface of the target 60 is composed of a metallic material to be deposited on the wafer 46, in this case, copper or aluminum.

A DC power supply 64 electrically biases the target 60 negatively with respect to the grounded shield 58 to cause the argon to discharge into a plasma such that the positively charged argon ions are attracted to the negatively biased target 60 and sputter metal atoms from it, some of which fall upon the wafer 46 and deposit a layer of the target material on it.

Advantageously, the reactor 30 additionally includes an inductive coil 68, for example, the illustrated one-turn coil, wrapped around the central axis 34 just inside of the grounded shield 58 and axially positioned between the pedestal 44 and the target 60. The coil 68 is supported on the grounded shield 58 or another inner tubular shield but electrically isolated therefrom. A second RF power supply 70 applies RF current to the coil 68 to induce an axial RF magnetic field within the chamber and hence generate an azimuthal RF electric field that effectively couples power into the plasma and increases its density. The inductively coupled RF power may be used as the primary plasma power source when the target power is turned off and the sputter reactor is being used to etch the wafer 46. The inductively coupled RF power may alternatively be used in combination with a powered target 60 to increase the density of the plasma extending to the target 60. The coil 68 is preferably composed of metallization metal, that is, copper or aluminum, to act as a secondary target under the proper conditions or at least not contribute impurities to the metallization.

The target sputtering rate can be greatly increased by placing a magnetron 80 in back of the target 60. The magnetron 80 preferably is small, strong, and unbalanced. Such a magnetron includes an inner pole 82 of one magnetic polarity along the central axis 34 and an outer pole 84 which surrounds the inner pole 82 and has the opposite magnetic polarity. The magnetic field extending between the poles 82, 84 in front of the target 60 creates a high-density plasma region 86 adjacent the front face of the target 60, which greatly increases the sputtering rate. The magnetron 80 is unbalanced in the meaning that the total magnetic intensity of the outer pole 84, that is, the magnetic flux integrated over its bottom face, is substantially greater than that of the inner pole 82, for example, by a factor of two or more. The unbalanced magnetic field projects from the target 60 toward the wafer 46 to extend the plasma and to guide ions to the wafer 46. To provide a more uniform target sputtering pattern, the magnetron 80 is small and offset from the central axis 34, but a motor 87 drives a rotary shaft 88 extending along the central axis 14 and fixed to a plate 90 supporting the magnetic poles 82, 84 to rotate the magnetron 80 about the central axis 34 and produce an azimuthally uniform time-averaged magnetic field. If the magnetic poles 82, 84 are formed by respective arrays of opposed cylindrical permanent magnets, the plate 90 is advantageously formed of a magnetic material such as magnetically soft stainless steel to serve as a magnetic yoke. A ring magnet 94 annular about the central axis 34 may be placed outside the chamber sidewalls generally in back of the RF coil 68 to guide the sputtered ions towards the wafer 46. Advantageously, the ring magnet 94 has a magnetic polarity matching that of the outer pole 84 of the magnetron 84 so as to reinforce and continue the unbalanced field projecting from the outer pole 84 towards the wafer 46. The ring magnet 94 may be implemented as a circular array of vertically polarized permanent magnets or as one or more electromagnetic coils coaxial with the central axis 34, as Gung et al. have disclosed in provisional application 60/574,905, filed May 25, 2004.

Further, according to one aspect of the invention, a helium gas source 100 supplies helium gas as a sputter etching gas to the chamber 32 through another mass flow controller 102. It is then advantageous to supply helium through yet another mass flow controller 104 to the pedestal cavity 52 as a thermal transfer gas. Conventionally argon has been used as the thermal transfer gas in sputter reactors while helium is used in etch reactors.

A computerized controller 106 operating from a recipe programmed into a disk 108 such as a CDROM or other writable storage medium controls the mass flow controllers 40, 50, 102, the power supplies 54, 64, 70 and the vacuum system 36 according to the recipe desired to process the wafer 46. The controller 106 operates with an operating system such as Windows, Unix, or Linux and an overall tool control program entered into the controller by the same or other disk 108.

The invention is advantageously practiced with the mass of a sputter etch ion and its energy chosen to selectively sputter etch the seed layer preferentially to the underlying barrier layer. That is, the wafer 46 is being ion milled (sputter etched) by helium or other ions, and preferably the milling is preferential for the metallization over the barrier material. For example, copper should be sputter etched selectively to tantalum or aluminum should be sputter etched selectively to titanium. It is, however, understood that the energetic ions may be neutralized prior to striking the wafer 46.

Figure 3:
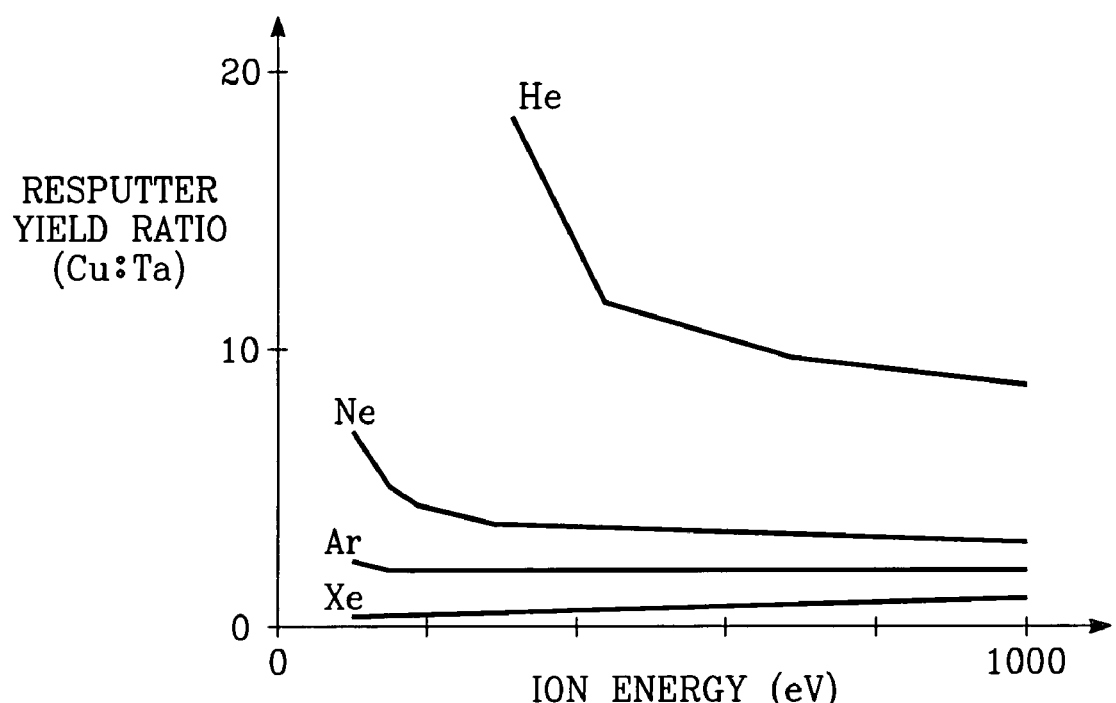
FIG. 3 is a graph showing copper to tantalum resputter selectivity for rare gas sputtering as a function of the energy of various rare gases.

The selectivity may be achieved by relying upon the relative masses of the seed element, the barrier metal, and the sputter ion. Note that the nitrogen component of a metal nitride barrier is not considered to be crucial. If the nitrogen is sputtered away but the barrier metal remains, the remaining metal atoms can form metallic bonds between them and continue to form part of the barrier layer. The plots of the graph of FIG. 3 show the dependence of the sputter yield ratio between copper and tantalum, that is, the amount of copper versus that of tantalum sputtered by ions of four noble gases, helium neon, argon, and xenon as a function of the ion energy. Xenon has a generally sub-unity resputter ratio, indicating tantalum is sputtered somewhat preferentially to copper. Argon selectively sputter etches copper to tantalum by a relatively small and substantially constant factor. Neon selectively etches copper to tantalum by a somewhat larger factor that however increases below about 100 eV. Helium selectively etches copper to tantalum by a larger factor and that factor substantially increases below about 500 eV. It is desirable to selectively etch seed copper by a large factor over the underlying tantalum. The selectivity depends upon the relative masses of the milling ion, the atom of the metallization, and the atom of the barrier metal. Helium is lighter than either copper or tantalum. If an energetic helium ion is to sputter a stationary copper or tantalum atom, it must transfer a threshold energy to the copper or tantalum atom to allow it to escape from its bound state in the solid. Because momentum as well as energy must be conserved in the collision, the energy transfer is less effective for a light energetic ion striking a heavy atom. However, the mass mismatch is larger between helium and tantalum than between helium and copper. Therefore, helium is more effective at sputtering copper than at sputtering tantalum. The same mass relationships hold between helium, aluminum, and titanium, which is the typical barrier material for aluminum.

Figure 4:
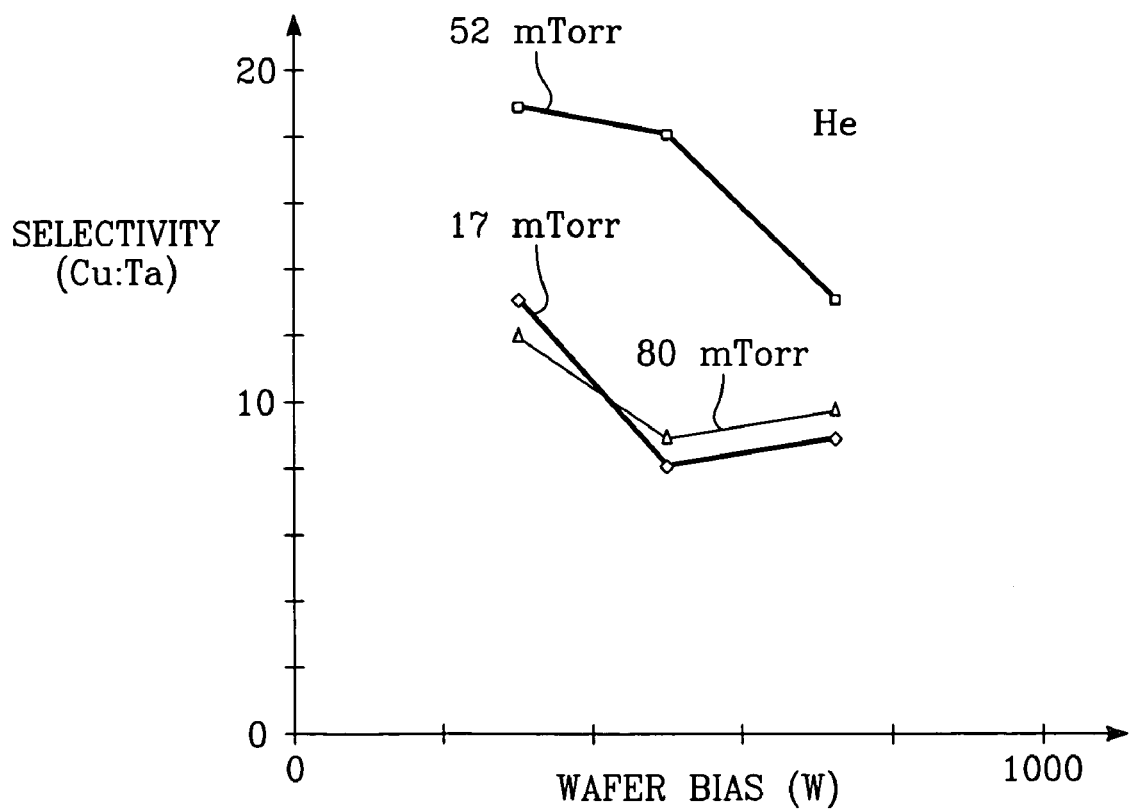
FIG. 4 is a graph showing copper to tantalum etch selectivity for helium sputter etching as a function of bias in a semiconductor processing reactor.

The data of FIG. 3 were derived from computer simulations with a variable ion energy. It is advantageous to commercially implement this invention such that a large wafer or other substrate is processed in a plasma reactor in which a light-atom plasma is formed adjacent the wafer and the light ions of the plasma are accelerated across the plasma sheath to the requisite energy to sputter copper selectively to tantalum. It is particularly advantageous that the light-atom sputter etching be performed in a reactor used for other purposes, especially in the same sputter reactor used to deposit the seed layer. The etching selectivity have been tested in different types of commercially available reactors with different sputter gases. The data of FIG. 4 were obtained in a plasma pre-clean chamber designed for 300 mm wafers using a helium sputter gas at three different pressures. The blanket (planar) etch rates for copper and tantalum were measured at several wafer bias powers. The plot shows the ratio of etch rates between copper and tantalum, that is, the selectivity of helium sputtering copper to tantalum. Below 500 to 700 W, the blanket selectivity remarkably increases to almost 20 for a helium pressure of 52 mTorr. The selectivity is less for helium pressures of 17 and 80 mTorr.

Similar data were derived for neon and argon in sputter reactors having an RF coil similar to the reactor 30 of FIG. 2 with neon as a working gas. The neon selectivity ranges from 2 to 6 for pressures of between 1.3 and 10 mTorr but is fairly constant though slightly increasing with wafer bias. It is believed that the neon selectivity threshold energy is about 20 to 30 eV versus about 300 to 600 eV for helium. Argon selectivity measured at pressures of 1.3 to 10 mTorr is generally less than about 2 and increases with bias power. No selectivity energy threshold is observed or is expected for argon in the illustrated energy range.

Figure 5:
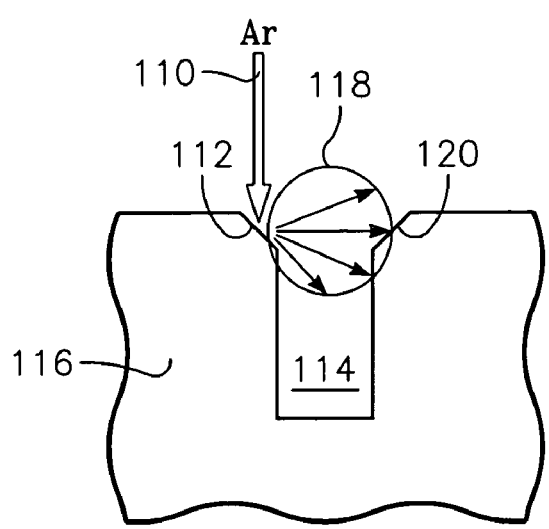
FIGS. 5 and 6 are schematic representations of the different angular sputter distributions for respectively argon and helium sputter ions incident on a substrate of a heavy element.

Another differential effect between argon and helium is more difficult to quantify but begins to address the two-dimensional geometry at the top of the via hole 16 where the overhangs 28 develop. As schematically illustrated in the cross-sectional view of FIG. 5, when an energetic argon ion beam 110 strikes an upper, possibly beveled corner 112 of a hole 114 formed in a body having an elemental mass near that of argon, for example copper, the argon ions sputter copper atoms from the corner 112. An emission angular distribution 118 of sputtered copper is strongly peaked in the direction perpendicular to the argon beam 110, that is, horizontal towards a corner 120 on the other side of the hole 114. Simultaneously, the relatively wide argon beam 110 is sputtering the second corner 120 and its emission distribution 118 is directed to the first corner 112. The graphical representation is based on experimental data for the dependence of sputtered distribution as a function of the incidence angle for the energetic ion. For argon, the experimental data show that increasing the incidence angle of the local normal increases the sputter flux in the forward direction and reduces the flux in the backward direction. As a result, a large fraction of the copper sputtered from the two corners 112, 120 redeposits on the opposed corners 112, 120 so that the effective etching rate is significantly reduced. These corners 112, 120 represent the overhangs 28 of FIG. 1.

Figure 6:
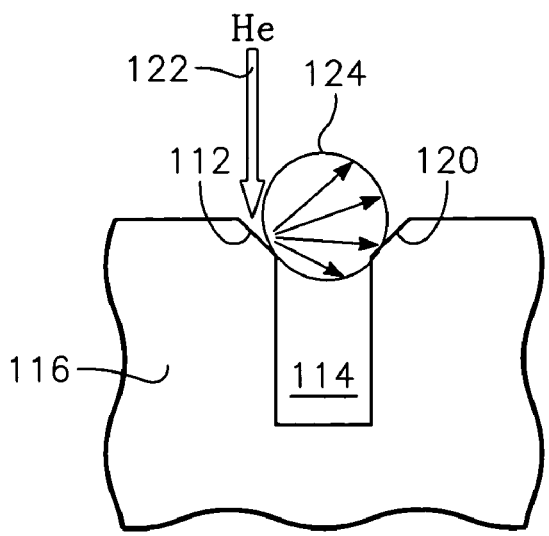

In contrast, as schematically illustrated in the cross-sectional view of FIG. 6, when a helium ion beam 122 strikes the corner 112 of the much heavier copper, it produces an emission angular distribution 124 which is more strongly directed backwardly and away from the opposed corner 120. These schematic results are based upon experimental data which show that increasing the incidence angle for energetic helium ions causes less increase in forward sputtering than for argon. There is some redeposition on the opposed corner 120 but most of the sputtered copper is directed away from the hole 114. Thereby, the effective sputter etch rate is increased because of geometric effects.

Figure 1:
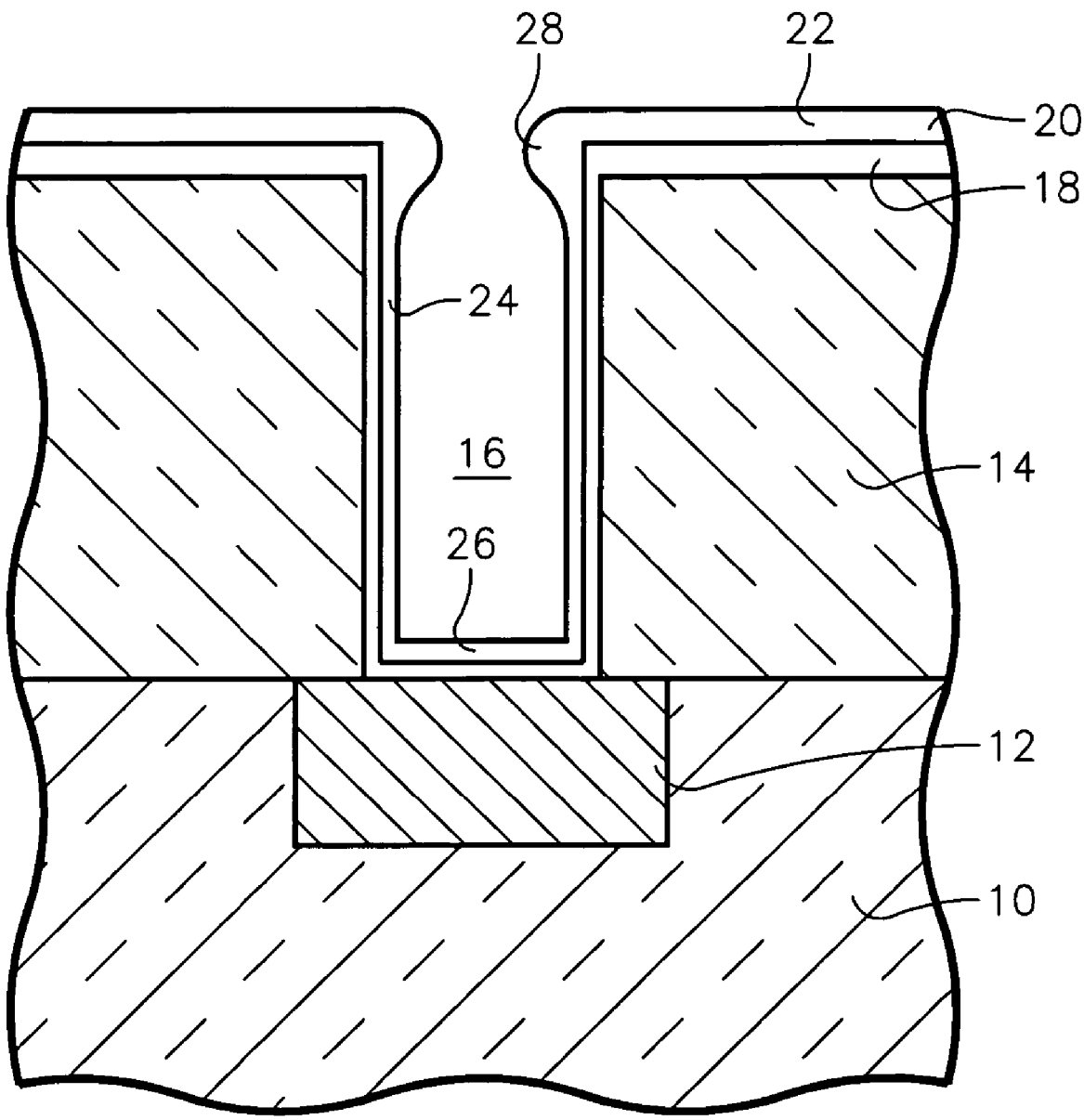
FIG. 1 is a cross-sectional view of a via hole of the prior art including overhangs forming at the top of the hole.
Figure 7:
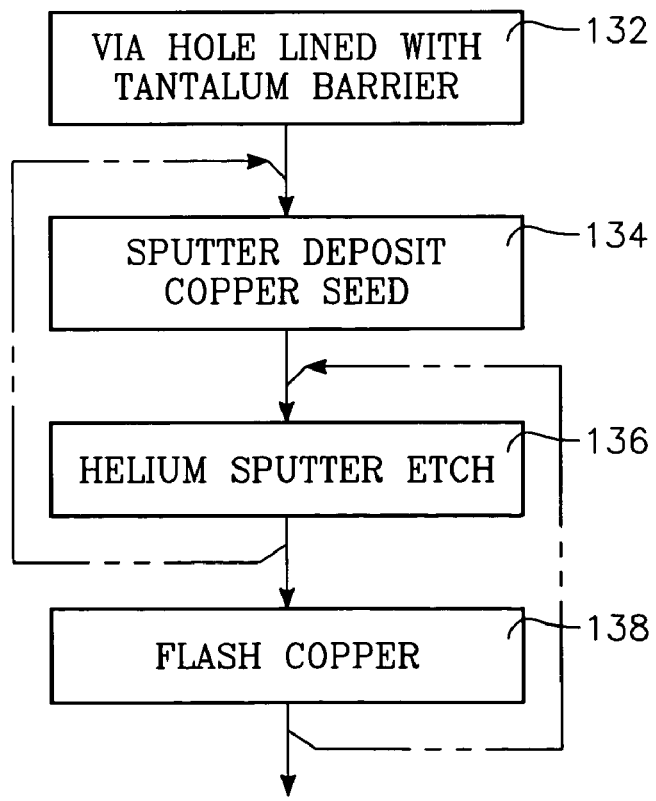
FIG. 7 is a flow diagram of one embodiment of the invention for a copper seed process.

Using this theory as guidance although the invention does not require a complete understanding of the mechanisms, one method of practicing the invention includes the following steps illustrated in the process flow of FIG. 7 for copper metallization. In step 132, a substrate 46 is loaded into the sputter reactor 30 of FIG. 2 having a copper target 60. The substrate 46 is preformed, as shown in FIG. 1, with a hole 16 in its dielectric layer 14, and the substrate 46 includes its hole 16 and sidewall therein is covered with the thin tantalum-based barrier layer 28. A sputter deposition step 134, performed in the copper sputter reactor 30, nearly conformally deposits a thin copper seed layer 22 according to a predetermined recipe. Typical sputter deposition process conditions dictated by the recipe include the DC power supply 64 delivering a high amount of DC power to the target 60, the pedestal RF power supply 54 delivering a relatively high bias power to the pedestal 44, and the RF coil power supply 70 delivering relatively little or no power to the RF coil 68. During the sputter deposition step 134, the argon gas source 38 delivers argon as a sputtering gas into the chamber but the argon flow is reduced and the chamber pressure is kept relatively low after plasma ignition because of the self-ionizing sputtering of copper afforded by the small magnetron 80. In the case of copper, it is possible that the SIP sputtering becomes self-sustaining so that the argon supply can be shut off after the plasma has been ignited. No coil power is required since the SIP plasma is self-sustaining or nearly so. Also during the sputter deposition step 134, no substantial amount of helium needs be delivered to the chamber. In the sputter deposition step 134, the copper seed layer 20 is deposited with acceptable coverage on the sidewall regions 24 of the hole and good coverage in the field region 22 and bottom portion 26 of the hole 16. However, the deleterious overhangs 28 are likely to form in less aggressive sputtering conditions.

In a sputter etch step 136 performed in the same copper sputter reactor 30, conditions are changed to sputter etch the copper overhangs 28 in the wafer 46 preferentially to the underlying tantalum 18. No copper sputter deposition needs to occur during the sputter etching step 136. The selectivity is particularly important at the corners of the hole 16 at which the overhangs 28 form. In one method of practicing the invention, the sputter etch step 136 may be characterized by the argon gas source 38 delivering little or no argon but the helium gas source 48 delivering a significant amount of helium or other low-mass gas into the chamber. In this embodiment of the invention, the sputter etch step 136 may also be characterized by the DC power supply 64 delivering little if any power to the target 60 since no target sputtering is required and the RF coil power supply 70 delivering a significant amount of power to the RF coil 68 since the RF coil 68 is the primary source of power for generating the plasma during the etch step 136. During the sputter etch step 136, the RF pedestal power supply 54 biases the pedestal 44 with a sufficient amount of power such that the negative DC bias developed on the pedestal 44 is between the thresholds for copper and tantalum, that is, below about −500 VDC with respect to the grounded shield 58. A preferred range is about −100 to −600 VDC for helium.

The helium ion sputter is particularly effective against the exposed copper overhangs 28 but, because of the geometry, does not significantly etch the copper sidewalls 24 within the via hole 16. It is possible that the helium ion sputter etching completely removes the overhangs 28 and further etches through the copper field region 22. However, because of the strong selectivity of etching copper to tantalum, the barrier tantalum acts as an etch stop. Some tantalum may be removed but as long as the helium sputter etch is not excessively prolonged, the tantalum barrier is not breached.

During the helium etch step, helium is advantageously used as the thermal transfer gas supplied to the pedestal cavity 52 while, during the deposition steps 134, 138, either helium or argon may be used.

The relative amounts of sputter deposition and sputter etching may be quantified by field thicknesses, which are easily measured, but do not reflect thicknesses within the hole. Some combinations which have been used for 65 nm vias are (1) 90 nm of deposition followed by 30 nm of etching, (2) 75 nm of deposition followed by 50 nm of etching, and (3) 50 nm of deposition followed by 25 nm of etching, all measured in the copper field region.

If a separate etch step is performed, it is difficult to ignite helium into a plasma. Instead, argon may be supplied into the chamber at a few milliTorr pressure and ignited into a plasma. Then, preferably with the RF coil turned on, argon flow is stopped and instead the desired helium sputtering etching gas is flowed into the chamber.

The process may include a single copper seed deposition step 134 followed by a single helium sputter etch step 136. However, the process may be modified to include a plurality of sequences of the two steps 134, 136 such that a reduced amount of copper is deposited in step 134 and less helium etching of copper is performed in step 136. The plural sequences provide the advantage that the overhangs do not grow to such proportions as to substantially block the copper deposition in the sidewall regions 24.

If the helium etch step 136 has removed substantially all the copper field region 22, there is no significant copper electrode available for electroplating copper in the field area atop the dielectric layer 14 as well as no electrical connection to the copper sidewall region 24. This situation can be remedied by a short copper flash step 138 performed in the same copper sputter reactor 30 to deposit a relatively thin copper layer, particularly in the field area, that is, to a thickness less than that of the primary deposition step. The flash layer may be deposited to a blanket thickness of, for example, 5 to 50 nm, preferably 5 to 20 nm for advanced geometries. The flash step may rely upon a more isotropic flux distribution, for example, with reduced or even zero wafer biasing. However, a successful recipe uses parameters for the flash step close to those for the primary copper deposition.

The process of FIG. 7 may be modified by performing a plural sequence of the two steps of helium sputtering etching 136 and flash copper deposition 138.

Following the copper flash step 138, the wafer 46 is removed from the copper sputter reactor 30 of FIG. 2 and is subjected to copper electrochemical plating (ECP) to fill copper into the hole 16 of FIG. 1, but the sputter etching of the invention reduces the overhangs 28 during the electroplating and the copper flash layer may serve as the electroplating electrode. For dual damascene, the wafer also includes surface trenches for horizontal interconnects, which the electroplating also fills. The electroplating also forms a copper layer over the field region, which is thereafter typically removed by chemical mechanical polishing (CMP) to complete the metallization process.

It maybe advantageous to perform all three active steps 134, 136, 138 of FIG. 7 in the same sputter reactor 30 of FIG. 1 or other copper sputter reactor. However, in some other situations, it may be advantageous to perform the sputter etching 134 in a separate reactor other than the one or two copper sputter reactors used for the copper seed deposition 136 and copper flash 138. In this case, the etch reactor does not require a sputter target or magnets. A separate etching chamber may be useful in an in-line tool in which substrates pass in a linear path through several reactors. However, for many commercially important applications, it is desired that the copper seed deposition 134, the light-ion sputter etch 136, and the copper flash 138, if needed, be performed in the same copper sputter reactor to reduce transfer and pump-down times and reduce the number of chambers required for a metallization process.

An integrated process has been developed in which all three steps 134, 136, 138 are performed in the same reactor of FIG. 2. Exemplary process parameters are given in TABLE 1 for a chamber sized for a 300 mm wafer.

TABLE 1

|  | Deposit | Etch | Flash |
| --- | --- | --- | --- |
| DC Target Power (kW) | 38 | 0 | 38 |
| RF Coil Power (kW) | 0 | 1.5 | 0 |
| Wafer Bias Power (W) | 600 | 800 | 300 |
| Chamber Argon (sccm) | 0 | 0 | 0 |
| Chamber Helium (sccm) | 0 | 25 | 0 |
| Backside Argon (sccm) | 4 | 4 | 4 |
| Pressure (milliTorr) | 0.2 | 2.5 | 0.2 |
| Rate (nm/s) | 117 |  | 7.5 |

Argon was supplied into the chamber to ignite the plasma while a small bias was being applied to the wafer. During deposition, self-ionizing plasma can sustain itself without any additional gas supply although there is a small amount of thermal transfer gas leaking from the backside of the wafer. The wafer was patterned with Ta-lined trenches about 80 nm wide and 240 nm deep. Micrographs taken after the deposition step but before the etch step showed a relatively thin and non-uniform copper sidewall coverage. The thinnest local areas present possible failure locations. Overhangs were moderate. Micrographs taken after the etch step showed a thicker and much more uniform sidewall coverage. Bottom coverage was reduced and the overhangs were somewhat reduced. It is believed that the increased and more uniform sidewall coverage results from helium resputtering copper from the bottom and the upper corners onto the sidewalls. Micrographs taken after the flash step showed greatest deposition depth in the field areas.

The more uniform sidewall coverage provided by the etching step indicates that energetic ion sputtering is useful independently of the need to reduce overhangs. That is, after or during copper seed deposition, it is desirable to subject the wafer to significant ion milling arising from strong wafer biasing. This effect is separate from the resputtering selectivity between copper and tantalum and hence can be obtained even if argon is used as the milling gas.

It is possible to simultaneously perform the sputter deposition and the ion milling of the wafer, for example, copper seed deposition over tantalum barrier. In one embodiment of a simultaneous process performed in the reactor 30 of FIG. 2, the target 60 and the RF coil 68 are simultaneously powered and argon is supplied into the chamber 32. Argon can sputter both the target 60 and the copper overhangs in the wafer 46, as well as uniformizing the copper sidewalls, but the helium ions are ineffective at sputtering the tantalum barrier in the wafer 46.

A series of experiments were performed in a 300 mm sputter reactor in which a copper seed layer in a 65 nm tantalum-lined via hole was deposited in 65 nm vias with 38 kW of DC power applied to the target, 2 kW of RF power applied to the RF coil, and with an argon pressure of 1 milliTorr. The wafer RF bias was varied between 0 and 800 W. The wafer bias attracts not only the copper sputter ions but also the argon ions from the coil plasma. All results were acceptable, but sidewall smoothness was improved with at least 300 W of bias power. The best results were obtained with a bias of 300 to 600 W.

Similar high selectivity and selectivity threshold is expected with the aluminum/titanium metallization structure even though the atomic masses of aluminum, titanium, and helium are closer than with copper, tantalum, and helium. In one embodiment of an aluminum metallization process, the steps of the process FIG. 7 are modified to substitute titanium for tantalum and aluminum for copper. Also, the flash step may not be necessary and a warm aluminum sputter fill may be used to fill the hole. Other material combinations are possible. Refractory ruthenium or tungsten barriers should behave analogously to tantalum barriers relative to copper metallization. In general, it is preferred that the layer being etched have a lighter mass than the underlying layer, which may thereby act as an etch stop layer. The sputtering atom preferably has a mass less than that of the layer being etched.

The minimum mass of hydrogen suggests its use for the differential sputtering. However, hydrogen presents several problems. Pure hydrogen introduces an explosive hazard. The minimum hydrogen energy required to sputter even a light atom from the wafer is probably in the range of several thousands of eV, which energy is difficult to obtain from a plasma in current commercial equipment. Further, energetic hydrogen ions with their very small atomic radius are likely to channel into the substrate and be implanted there, either causing a crystal defect or creating an electrical state.

Nitrogen offers some advantages as the sputtering gas, particularly for copper metallization. It is much lighter than copper and very inexpensive. Its effective selectivity over tantalum may be somewhat increased by the possibility of the residual nitrogen atom of low energy bonding with tantalum, which is not completely unfavorable. Under the proper conditions, nitrogen like the noble gases is inactive to metallization metals, particularly copper.

Neon also offers some advantages as the sputter gas. It is inert. It is still much lighter than copper and has demonstrated a reasonable selectivity over tantalum even at energies above the selectivity threshold energy. Its increased mass over helium provides a higher etch rate and hence shorter etch time, a feature also provided by nitrogen.

The advantageous use of argon in uniformizing sidewall coverage suggests that a sputter working gas may be composed of either one or two or more of the noble gases helium, neon, and argon. Multiple noble gases combine selective etching with uniformizing.

The invention thus provides several advantages in metallizing especially copper but also aluminum. Several of these advantages are obtained with some additional plumbing and an additional RF coil to an aluminum or copper sputter reactor. Overhangs in high aspect-ratio holes can be significantly reduced. Sidewall uniformity and smoothness may be greatly improved.

The invention claimed is:

1. A method of forming in a substrate a metallic layer principally comprising a metallization metal having a first atomic mass overlying a barrier layer comprising a barrier metal having a second atomic mass greater than said first atomic mass, said metallic and barrier layers formed over at least sidewalls of a hole, said method comprising the steps of:
    a first step of sputter depositing said metallic layer in a sputter reactor including a target having a target surface area comprising said metallization metal from a plasma that is at least excited with argon as a first sputter gas; and
    a second step of sputter etching said metallic layer with a second sputter gas having a third atomic mass less than said first atomic mass.

2. The method of claim 1, wherein substantially more argon than helium is supplied into said sputter reactor in said first step and substantially more helium than argon is supplied into said sputter reactor in said second step.

3. The method of claim 1, wherein substantially more helium is supplied into said sputter reactor in said second step than in said first step.

4. The method of claim 1, wherein an amount of power applied during the second step of sputter etching step is substantially reduced from that applied during the first step of sputter depositing.

5. The method of claim 1, wherein said sputter etching step is performed in said sputter reactor.

6. The method of claim 5, wherein said sputter etching step includes applying RF power to a coil in said sputter reactor and applying RF biasing power to a pedestal electrode supporting said substrate.

7. The method of claim 1, further comprising a subsequent third step of sputter depositing another metallization layer in the sputter reactor including the target.

8. The method of claim 7, wherein said third step includes a process that produces a more isotropic flux than does said first step.

9. The method of claim 1, wherein said metallization metal is aluminum and said barrier metal is titanium.

10. The method of claim 9, wherein said second sputter gas comprises helium.

11. The method of claim 10, wherein said second sputter gas additionally comprises argon.

12. The method of claim 1, wherein said metallization metal comprises copper and said barrier metal comprises tantalum.

13. The method of claim 12, wherein said second sputter gas comprises neon.

14. The method of claim 12, wherein said second sputter gas comprises nitrogen.

15. The method of claim 12, wherein said second sputtering gas comprises helium.

16. The method of claim 15, wherein said second sputtering gas additionally comprises argon.

17. The method of claim 15, wherein said sputter etching step includes biasing a pedestal electrode supporting said substrate to have a voltage of between −100 and −600 VDC.

18. A method of forming in a substrate a first layer comprising a first element having a first atomic mass overlying a second layer comprising a second element having a second atomic mass greater than said first atomic mass, said metallic and baffler layers formed over at least sidewalls of a hole, said method comprising the steps of:
    a first step of sputter depositing said first layer in a sputter reactor including a target having a target surface area comprising said first element from a plasma that is at least ignited with a first sputter gas; and
    a second step of sputter etching said first layer with a second sputter gas comprising a gas having a third atomic mass less than said first atomic mass.

19. The method of claim 18, wherein said first sputter gas is argon.

20. The method of claim 18, wherein said first element is a metallization metal and said second element is a baffler metal.

21. The method of claim 20, wherein said metallization metal is copper and said second baffler metal is tantalum.

22. The method of claim 18, wherein said second sputter gas comprises at least one of helium, nitrogen, and neon.

23. A method of depositing a seed layer comprising a metallization metal selected from the group consisting of aluminum and copper in a hole formed in a substrate and having at least sidewalls of said hole covered with a baffler layer of a refractory-based material, said method performed in a plasma sputter reactor including a target having a surface layer comprising said metallization metal, an RF inductive coil within said reactor, and a pedestal electrode for supporting said substrate, said method comprising the steps of:
sputter depositing a first layer of said metallization metal while applying a first amount of DC target power to said target, biasing said pedestal with a first amount of RF biasing power to excite a plasma within said reactor to sputter said target, substantially no power being applied to said RF inductive coil during said sputter depositing step; and
sputter etching said first layer while biasing said pedestal with a second amount of RF biasing power and applying RF power to said RF inductive coil to excite a sputtering gas into a plasma, substantially no power being applied to said target during said sputter etching step.

24. The method of claim 23, wherein said metallization metal is copper.

25. The method of claim 23, wherein said metallization metal is aluminum.

26. The method of claim 23, wherein said sputtering gas comprises at least one inactive gas selected from the group consisting of helium, nitrogen, neon, and argon.

27. The method of claim 26, wherein said inactive gas is helium.

28. The method of claim 27, wherein said second amount of RF biasing power creates a DC self-bias on said pedestal electrode of between −100 and −600 VDC.

29. A method of depositing a copper seed layer in a hole formed in a substrate and having at least sidewalls of said hole covered with a refractory baffler layer, said method performed in a plasma sputter reactor including a copper target, an RF inductive coil within said reactor, and a pedestal electrode for supporting said substrate, said method comprising the steps of:
sputter depositing a first layer of copper while applying a first amount of DC target power to said target to excite a plasma within said reactor to sputter said target, biasing said pedestal with a first amount of RF biasing power, substantially no power being applied to said RF inductive coil during said sputter depositing step; and
sputter etching said first layer while biasing said pedestal with a second amount of RF biasing power and applying RF power to said RF inductive coil to excite helium gas into a plasma, substantially no power being applied to said target during said sputter etching step.

30. The method of claim 29, wherein said refractory barrier layer comprises tantalum.

31. The method of claim 29, wherein during said sputter etching step a DC self-bias of between −100 and −600 VDC develops on said pedestal electrode.

32. A process for forming a copper seed layer in a substrate formed with a hole in a dielectric layer and performed in a magnetron plasma sputter reactor including an RF coil surrounding a processing space between a copper target and a pedestal supporting said during at least part of said process of the simultaneous steps of:
supplying a sputtering gas into said reactor;
providing a first level of RF power to said RF coil; and
biasing said pedestal, whereby ions of said noble gas excited into a plasma by said RF coil processes copper deposited onto said substrate;
wherein during part of said process said target is not substantially powered while said RF coil is powered.

33. The process of claim 32, wherein said sputtering gas comprises helium.

34. The process of claim 32, wherein said sputtering gas comprises neon.

35. The process of claim 32, wherein said sputtering gas comprises argon.

36. The process of claim 32, wherein said sputtering gas comprises at least two of helium, nitrogen, neon, and argon.

37. The process of claim 32, further comprising the previous step of:
biasing said target with sufficient power to sputter material from it onto said substrate while said RF coil is biased if at all with less than said first level of RF power.

38. The process of claim 32, wherein said supplying steps supplies both helium and argon into said reactor and further comprising the simultaneous step of biasing said target to sputter material from it onto said substrate.

39. A method of depositing a copper seed layer in a hole formed in a substrate and having at least sidewalls of said hole covered with a refractory barrier layer, the method performed in a plasma sputter chamber including a copper target, an RF inductive coil within the chamber, and a pedestal electrode for supporting the substrate, the method comprising the steps of:
a first step of sputter depositing a first layer of copper on the substrate while supplying argon into the chamber, RF biasing the pedestal, and applying DC power to the target to excite an argon plasma to sputter the target; and
sputter etching the first layer while supplying helium into the chamber, RF biasing the pedestal, and applying RF power to said RF inductive coil to excite a helium plasma to sputter etch the substrate.

40. The method of claim 39, further comprising the subsequent step of a second step of sputter depositing a second layer of copper on the substrate while supplying argon into the chamber and applying DC power to the target to excite an argon plasma to sputter the target, less RF biasing being applied to the pedestal in the second step than in the first step.

* * * * *